(12) United States Patent
Su et al.

(10) Patent No.: US 9,634,020 B1
(45) Date of Patent: Apr. 25, 2017

(54) METHOD OF MAKING EMBEDDED MEMORY DEVICE WITH SILICON-ON-INSULATOR SUBSTRATE

(71) Applicant: Silicon Storage Technology, Inc., San Jose, CA (US)

(72) Inventors: Chien Sheng Su, Saratoga, CA (US); Mandana Tadayoni, Cupertino, CA (US); Nhan Do, Saratoga, CA (US)

(73) Assignee: Silicon Storage Technology, Inc., San Jose, CA (US)

( * ) Notice: Subject to any disclaimer, the term of this patent is extended or adjusted under 35 U.S.C. 154(b) by 0 days.

(21) Appl. No.: 15/225,425

(22) Filed: Aug. 1, 2016

Related U.S. Application Data

(60) Provisional application No. 62/238,638, filed on Oct. 7, 2015.

(51) Int. Cl.

| | |
|---|---|
| *H01L 27/115* | (2006.01) |
| *H01L 21/762* | (2006.01) |
| *H01L 27/11521* | (2017.01) |
| *H01L 21/84* | (2006.01) |
| *H01L 21/02* | (2006.01) |
| *H01L 21/28* | (2006.01) |
| *H01L 29/08* | (2006.01) |

(Continued)

(52) U.S. Cl.
CPC .. *H01L 27/11521* (2013.01); *H01L 21/02532* (2013.01); *H01L 21/02634* (2013.01); *H01L 21/28035* (2013.01); *H01L 21/28273* (2013.01); *H01L 21/76283* (2013.01); *H01L 21/84* (2013.01); *H01L 27/11531* (2013.01); *H01L 27/11534* (2013.01); *H01L 29/0847* (2013.01); *H01L 29/42328* (2013.01); *H01L 29/4916* (2013.01); *H01L 29/66825* (2013.01)

(58) Field of Classification Search
CPC ......... H01L 27/11521; H01L 21/02532; H01L 21/02634; H01L 21/28273; H01L 29/0847; H01L 29/42328; H01L 21/28035; H01L 29/4916; H01L 21/76283; H01L 29/66825; H01L 27/11534; H01L 27/11531; H01L 21/84
See application file for complete search history.

(56) References Cited

U.S. PATENT DOCUMENTS

| | | |
|---|---|---|
| 4,771,016 A | 9/1988 | Bajor et al. |
| 5,061,642 A | 10/1991 | Fujioka |

(Continued)

FOREIGN PATENT DOCUMENTS

| | | |
|---|---|---|
| EP | 2381470 | 10/2011 |
| JP | H08255846 | 10/1996 |

*Primary Examiner* — Savitr Mulpuri
(74) *Attorney, Agent, or Firm* — DLA Piper LLP (US)

(57) ABSTRACT

A method of forming a semiconductor device with memory cells and logic devices on the same silicon-on-insulator substrate. The method includes providing a substrate that includes silicon, a first insulation layer directly over the silicon, and a silicon layer directly over the first insulation layer. Silicon is epitaxially grown on the silicon layer in a first (memory) area of the substrate and not in a second (logic device) area of the substrate such that the silicon layer is thicker in the first area of the substrate relative to the second area of the substrate. Memory cells are formed in the first area of the substrate, and logic devices are formed in the second area of the substrate.

8 Claims, 16 Drawing Sheets

(51) Int. Cl.
*H01L 29/423* (2006.01)
*H01L 29/49* (2006.01)
*H01L 29/66* (2006.01)
*H01L 27/11534* (2017.01)
*H01L 27/11531* (2017.01)

(56) References Cited

U.S. PATENT DOCUMENTS

| | | | |
|---|---|---|---|
| 5,417,180 A | 5/1995 | Nakamura | |
| 5,888,297 A | 3/1999 | Ogura | |
| 6,338,993 B1 | 1/2002 | Lien | |
| 6,403,486 B1 | 6/2002 | Lou | |
| 6,747,310 B2 * | 6/2004 | Fan | H01L 27/11521 257/316 |
| 7,049,661 B2 | 5/2006 | Yamada et al. | |
| 7,119,396 B2 * | 10/2006 | Chen | H01L 21/28114 257/324 |
| 7,326,614 B2 * | 2/2008 | Kianian | H01L 21/28273 257/E21.209 |
| 7,868,375 B2 * | 1/2011 | Liu | H01L 21/28273 257/320 |
| 7,927,994 B1 * | 4/2011 | Liu | H01L 21/28273 257/320 |
| 8,104,477 B2 * | 1/2012 | Edlauer | A61B 90/14 128/845 |
| 9,202,761 B2 | 12/2015 | Makiyama et al. | |
| 9,276,006 B1 * | 3/2016 | Chen | H01L 29/7885 |
| 9,379,121 B1 * | 6/2016 | Chen | H01L 27/11521 |
| 9,431,407 B2 * | 8/2016 | Su | H01L 27/11531 |
| 9,484,261 B2 * | 11/2016 | Su | H01L 21/823425 |
| 9,496,369 B2 * | 11/2016 | Wu | H01L 29/42328 |
| 2004/0156236 A1 | 8/2004 | Masuoka | |
| 2009/0072270 A1 * | 3/2009 | Asbeck | H01L 29/205 257/190 |
| 2012/0181609 A1 | 7/2012 | Enders | |
| 2013/0207174 A1 * | 8/2013 | Wang | H01L 21/28273 257/316 |
| 2014/0097482 A1 * | 4/2014 | Tokunaga | H01L 21/28273 257/316 |
| 2015/0008451 A1 * | 1/2015 | Su | H01L 21/82342 257/77 |
| 2015/0263040 A1 * | 9/2015 | Su | H01L 27/1203 257/322 |
| 2016/0086962 A1 * | 3/2016 | Su | H01L 27/11531 438/157 |
| 2016/0163722 A1 * | 6/2016 | Chang | H01L 27/11521 257/316 |
| 2016/0190146 A1 * | 6/2016 | Zhang | H01L 27/11521 257/319 |
| 2016/0218110 A1 * | 7/2016 | Yang | H01L 21/30604 |

* cited by examiner

METHOD OF MAKING EMBEDDED MEMORY DEVICE WITH SILICON-ON-INSULATOR SUBSTRATE

RELATED APPLICATIONS

This application claims the benefit of U.S. Provisional Application No. 62/238,638 filed Oct. 7, 2015, and which is incorporated herein by reference.

FIELD OF THE INVENTION

The present invention relates to embedded non-volatile memory devices.

BACKGROUND OF THE INVENTION

Non-volatile memory devices formed on bulk silicon semiconductor substrates are well known. For example, U.S. Pat. Nos. 6,747,310, 7,868,375 and 7,927,994 disclose memory cells with four gates (floating gate, control gate, select gate and erase gate) formed on a bulk semiconductor substrate. Source and drain regions are formed as diffusion implant regions into the substrate, defining a channel region therebetween in the substrate. The floating gate is disposed over and controls a first portion of the channel region, the select gate is disposed over and controls a second portion of the channel region, the control gate is disposed over the floating gate, and the erase gate is disposed over the source region. Bulk substrates are ideal for these type of memory devices because deep diffusions into the substrate can be used for forming the source and drain region junctions. These three patents are incorporated herein by reference for all purposes.

Silicon on insulator (SOI) devices are well known in the art of microelectronics. SOI devices differ from bulk silicon substrate devices in that the substrate is layered with an embedded insulating layer under the silicon surface (i.e. silicon-insulator-silicon) instead of being solid silicon. With SOI devices, the silicon junctions are formed in a thin silicon layer disposed over the electrical insulator that is embedded in the silicon substrate. The insulator is typically silicon dioxide (oxide). This substrate configuration reduces parasitic device capacitance, thereby improving performance. SOI substrates can be manufactured by SIMOX (separation by implantation of oxygen using an oxygen ion beam implantation—see U.S. Pat. Nos. 5,888,297 and 5,061,642), wafer bonding (bonding oxidized silicon with a second substrate and removing most of the second substrate—see U.S. Pat. No. 4,771,016), or seeding (topmost silicon layer grown directly on the insulator—see U.S. Pat. No. 5,417,180). These four patents are incorporated herein by reference for all purposes.

It is known to form core logic devices, high voltage devices, input/output and/or analog devices on the same silicon substrate as non-volatile memory devices (i.e. typically referred to as embedded memory devices). As device geometries continue to shrink, core logic devices could benefit greatly from the advantages of SOI substrates. However, the non-volatile memory devices are not conducive to SOI substrates. There is a need to combine the advantages of core logic devices formed on an SOI substrate with memory devices formed on silicon bulk substrates.

BRIEF SUMMARY OF THE INVENTION

The aforementioned problems and needs are addressed by a method of forming a semiconductor device that includes providing a substrate that includes silicon, a first insulation layer directly over the silicon, and a silicon layer directly over the first insulation layer, epitaxially growing silicon on the silicon layer in a first area of the substrate and not in a second area of the substrate such that the silicon layer is thicker in the first area of the substrate relative to the second area of the substrate, forming memory cells in the first area of the substrate and forming logic devices in the second area of the substrate. The forming of each of the memory cells includes forming spaced apart first source and first drain regions in the silicon layer in the first area of the substrate, defining a channel region there between, forming a floating gate over and insulated from a first portion of the channel region, and forming a select gate over and insulated from a second portion of the channel region. Forming of each of the logic devices includes forming spaced apart second source and second drain regions the silicon layer in the second area of the substrate, and forming a conductive gate over and insulated from a portion of the silicon layer between the second source and second drain regions.

Other objects and features of the present invention will become apparent by a review of the specification, claims and appended figures.

DETAILED DESCRIPTION OF THE INVENTION

The present invention is an embedded memory device with non-volatile memory cells formed alongside logic devices on an SOI substrate. The silicon on the insulator is raised (i.e. enhanced in thickness) in just the memory array area, while the logic device remain formed on a thin silicon layer of the SOI substrate. The raised silicon allows for the formation of a floating gate oxide by using thermal oxidation, CVD, or combination of both, because thermal oxidation will oxidize silicon and make it thinner. The raised silicon also allows for the formation of a Source Line (SL) junction deep enough to sustain a higher breakdown voltage compared to that for the logic N+ junction. The SL junction will be deeper than logic N+ junction due to thicker silicon and higher HVII implant energy.

Figure 1:
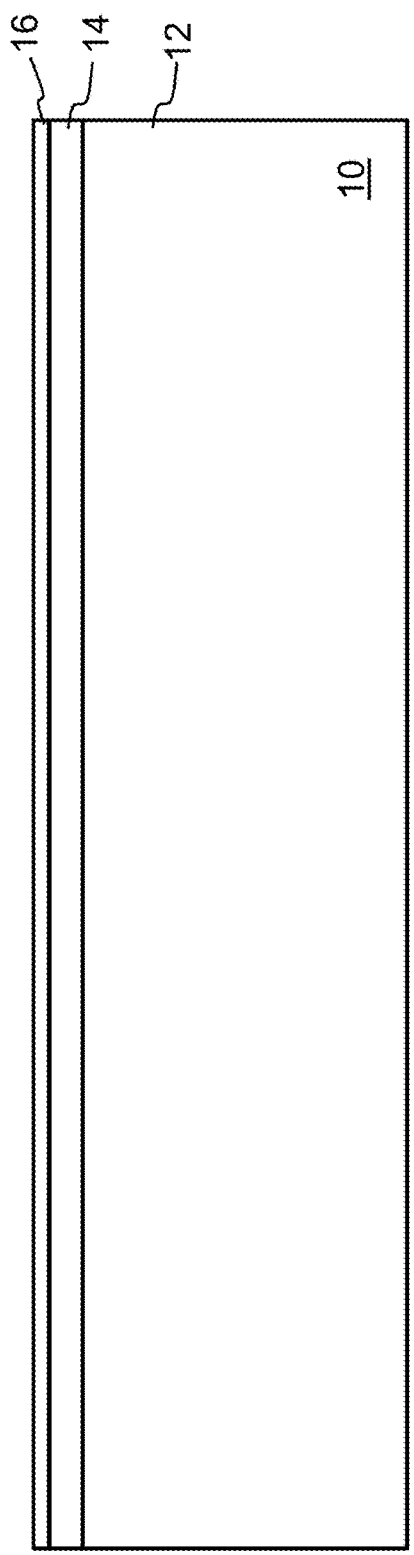
FIGS. 1-9, 11, 13 and 15 are side cross sectional views of the logic area and memory area illustrating in sequence the processing steps performed to manufacture the embedded memory device of the present invention.

The process of forming embedded memory devices on an SOI substrate begins by providing an SOI substrate 10, as illustrated in FIG. 1. The SOI substrate includes three portions: underlying (bulk) silicon 12, a layer of insulating material 14 (e.g. oxide—referred to as buried oxide—BOX) over the bulk silicon 12, and a thin layer of silicon (Si) 16 over the insulator BOX layer 14. Forming SOI substrates is well known in the art as described above and in the U.S. patents identified above, and therefore is not further described herein.

Figure 2:
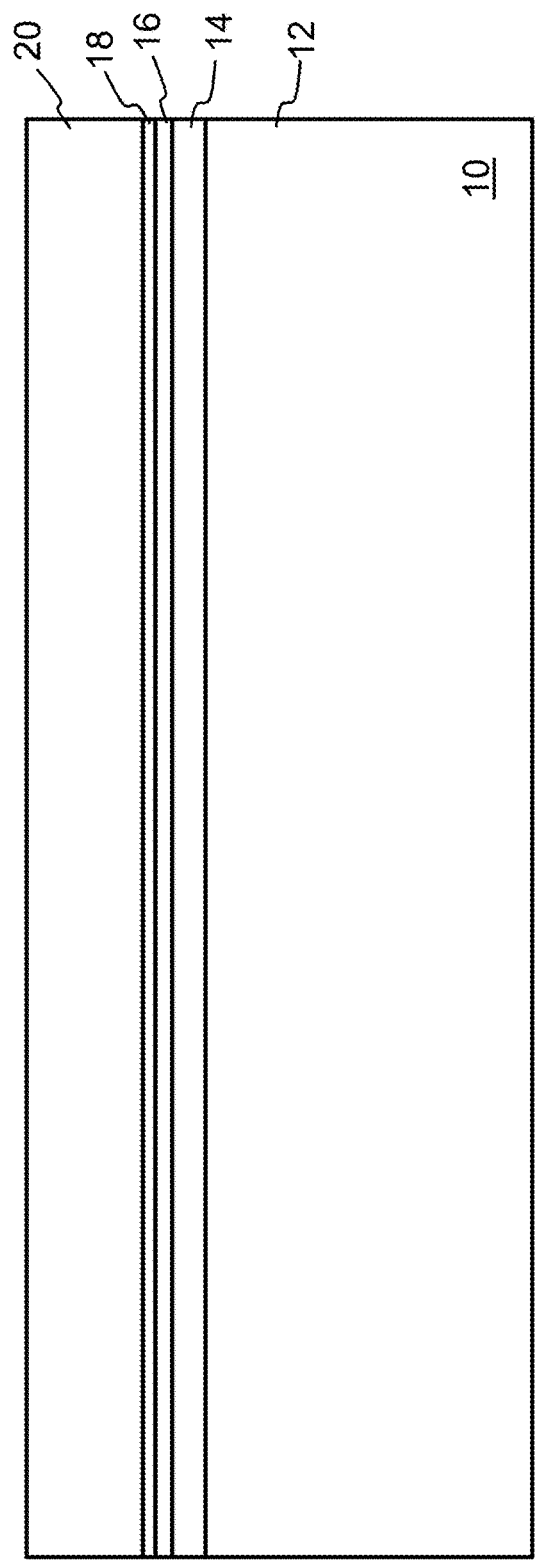
Figure 3:
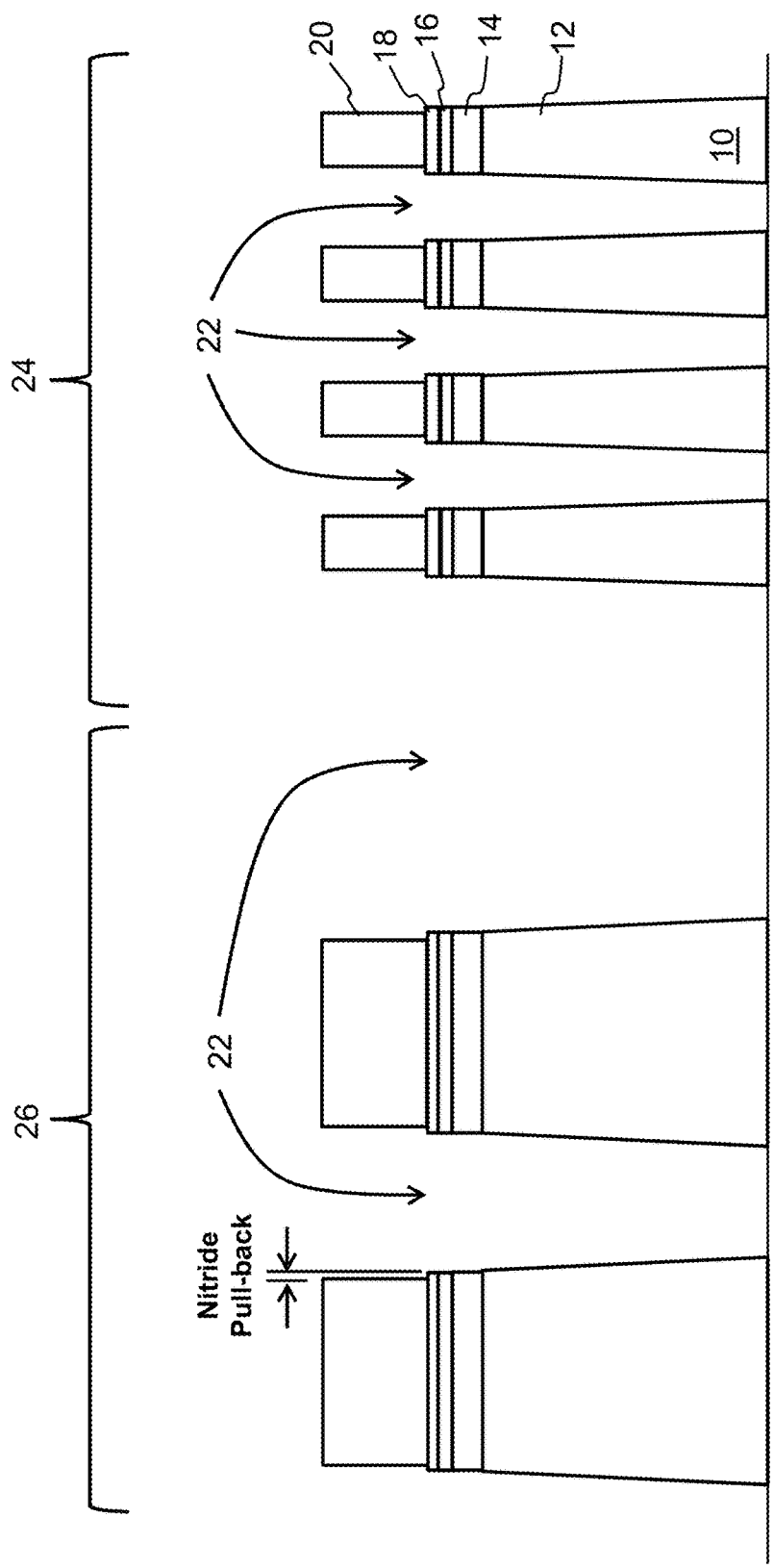

An oxide layer 18 (Pad Ox) is formed on the thin silicon layer 16, and a nitride layer 20 (pad nitride) is deposited on the oxide layer 18, as shown in FIG. 2. A photolithography process is performed which includes forming a photo-resist material on the nitride layer 20, followed by selectively exposing the photo-resist material to light using an optical mask, which is followed by selectively removing portions of the photo-resist material to expose portions of the underlying material (i.e., the nitride layer 20). Photolithography is well known in the art. A series of nitride, oxide, and silicon anisotropic etches are then performed in those portions left exposed by the photo resist to remove exposed portion of nitride 20, oxide 18, thin silicon 16, insulation 14 and bulk silicon 12, forming trenches 22 that extend through these layers and into the SOI substrate 10. An additional nitride etch (e.g. isotropic) is performed to pull back the edges of the nitride layer 20 relative to the layers underneath by a specific pull-back amount (e.g. 40 to 100 angstroms) to widen the trenches 22 at the nitride layer 20 but not at the oxide 18. The resulting structure is shown in FIG. 3 (after photo resist removal). The spacing, width and orientation of the trenches 22 varies between the memory area 24 of the substrate 10 (in which memory cells will be formed) and the logic area 26 of the substrate 10 (in which logic devices will be formed).

Figure 4:
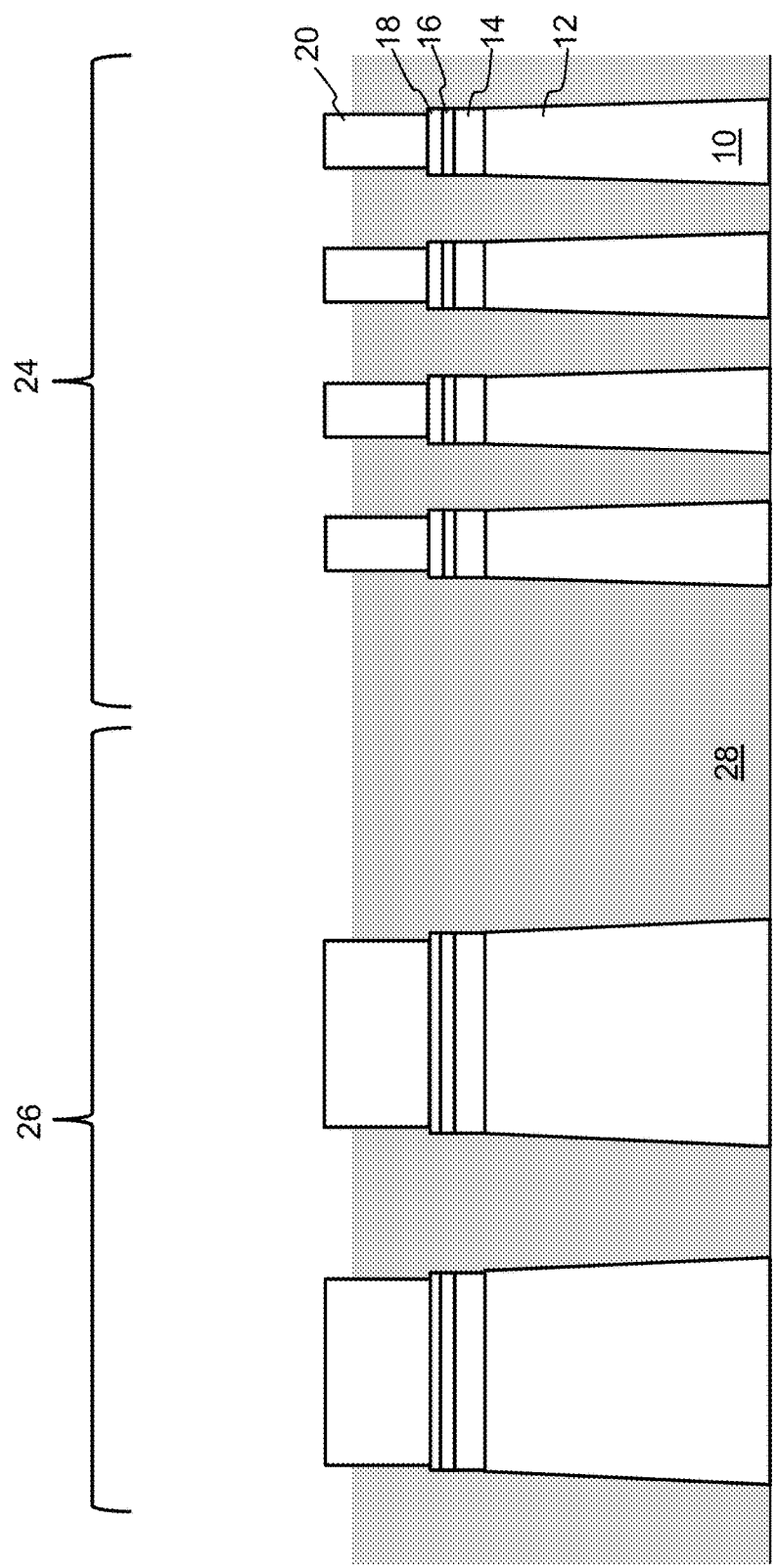

The trenches 22 are then filled with an insulating material 28 such as CVD oxide (e.g., HDP oxide—High Density Plasma, or HARP oxide—High-Aspect-Ratio Process) by an oxide deposition and oxide etch (e.g. chemical mechanical polish—CMP—using the nitride 20 as an etch stop). Preferably, a recess etch is used to lower the tops of the STI oxide 28 below the top of the nitride layer 20, resulting in the structure shown in FIG. 4. This STI insulating material serves as isolation regions for both the logic area 26 and memory area 24.

Figure 5:
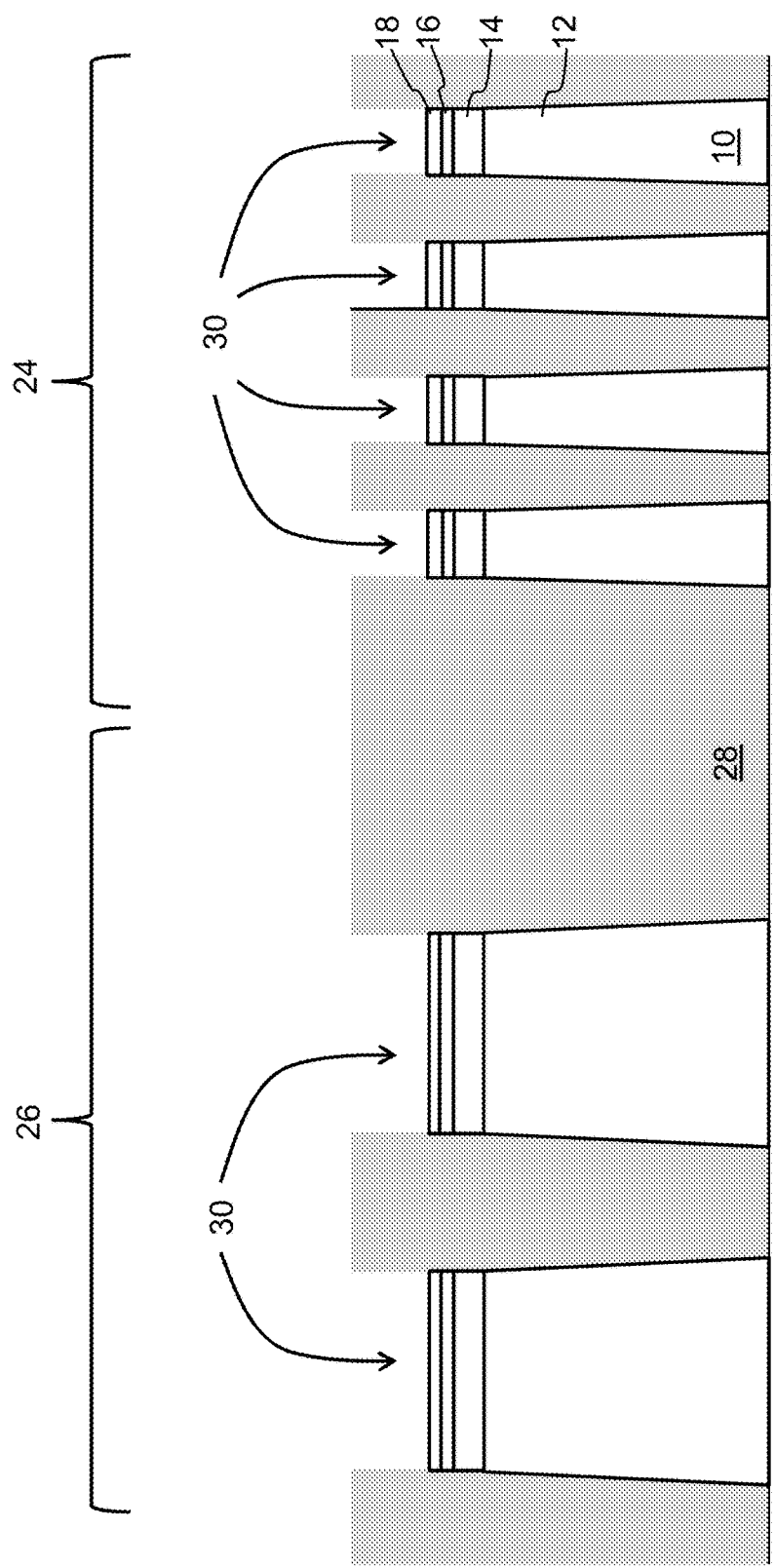
Figure 6:
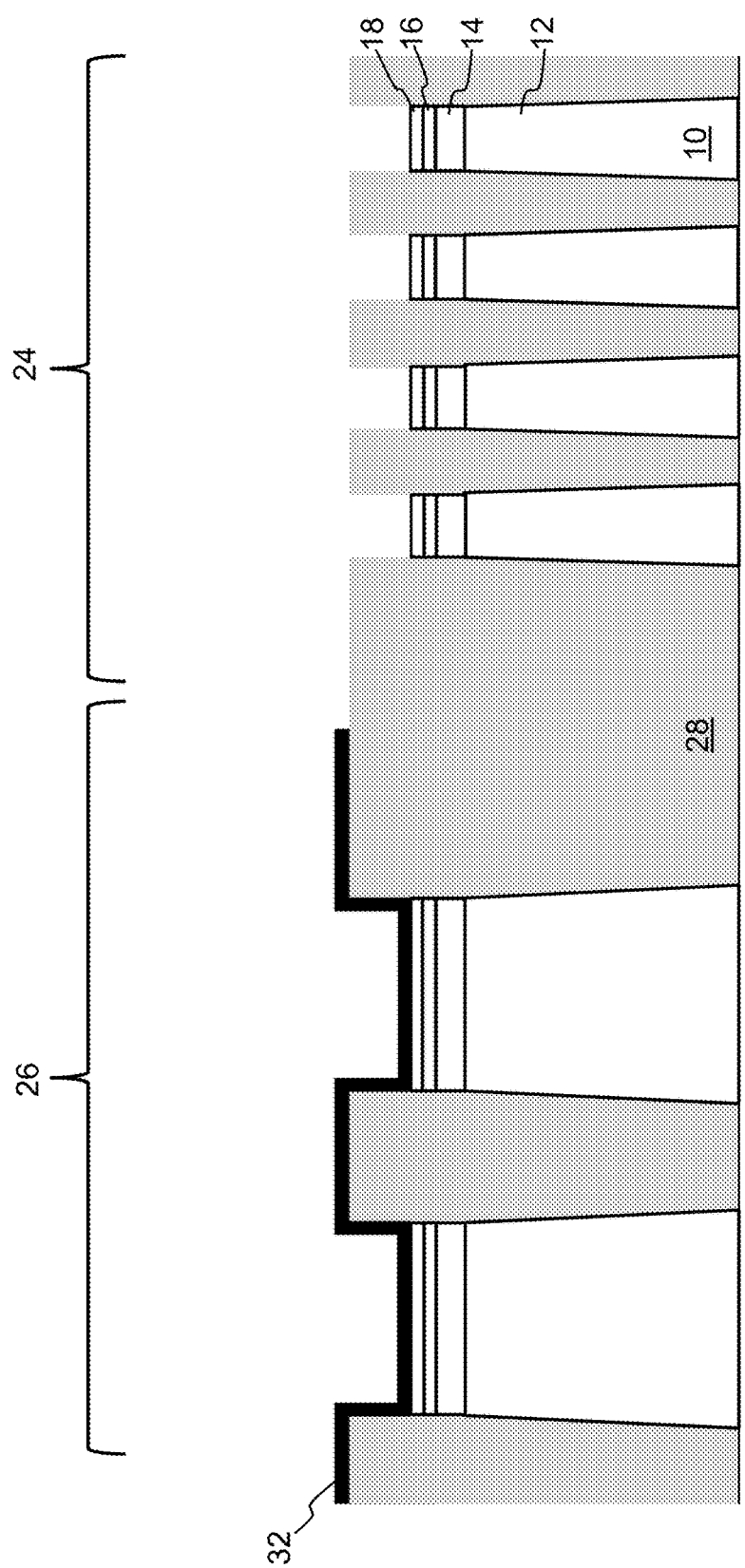
Figure 7:
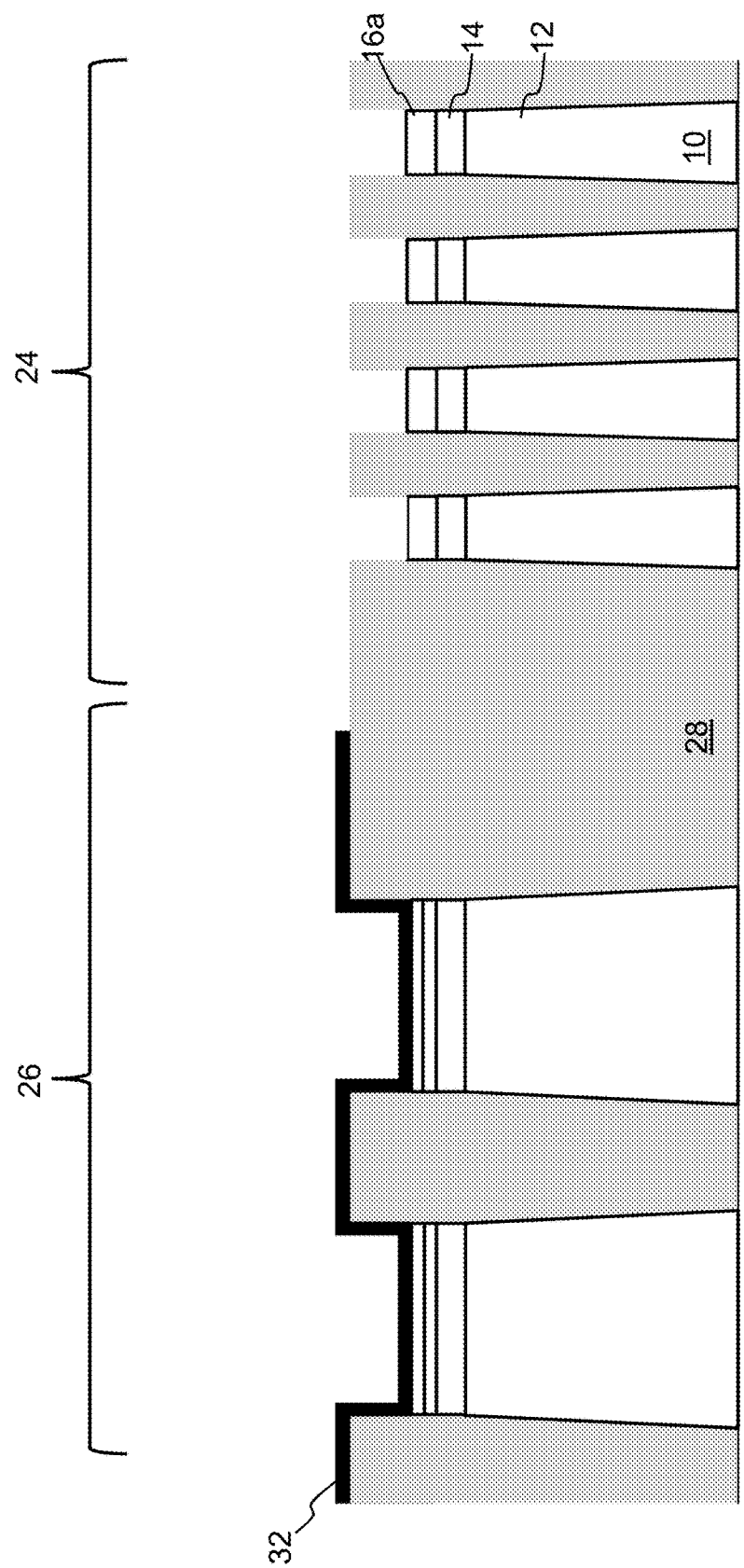

A nitride etch is next performed to remove the nitride layer 20, leaving second trenches 30 between the pillars of STI oxide 28, as illustrated in FIG. 5. A layer of insulation material 32 (e.g. nitride—Cap Nitride) is formed over exposed surfaces of the structure by, for example, nitride deposition. A photolithography process is performed to form photo-resist over the structure, followed by a masking step in which the photo resist is removed from the memory area 24 but not the logic area 26 of the structure. A nitride etch is performed to remove nitride layer 32 from the memory area 24, as shown in FIG. 6 (after photoresist removal). An oxide etch is performed to remove the oxide layer 18 at the bottoms of the second trenches in memory area. The oxide etch also may reduce the height of STI oxide 28 in the memory area 24. Oxide layer 18 is protected by nitride layer 32 in the logic device area 26 and maintained. Silicon is then epitaxially grown on the exposed thin silicon layer 16 at the bottoms of second trenches 30 in the memory area 24 to obtain a thicker silicon layer 16a, as shown in FIG. 7. This silicon epitaxial growth effectively increases the thickness of the silicon layer 16a over the BOX layer 14 in the memory area 24, without affecting the thickness of the silicon layer 16 over the BOX layer 14 in the logic area 26.

Figure 8:
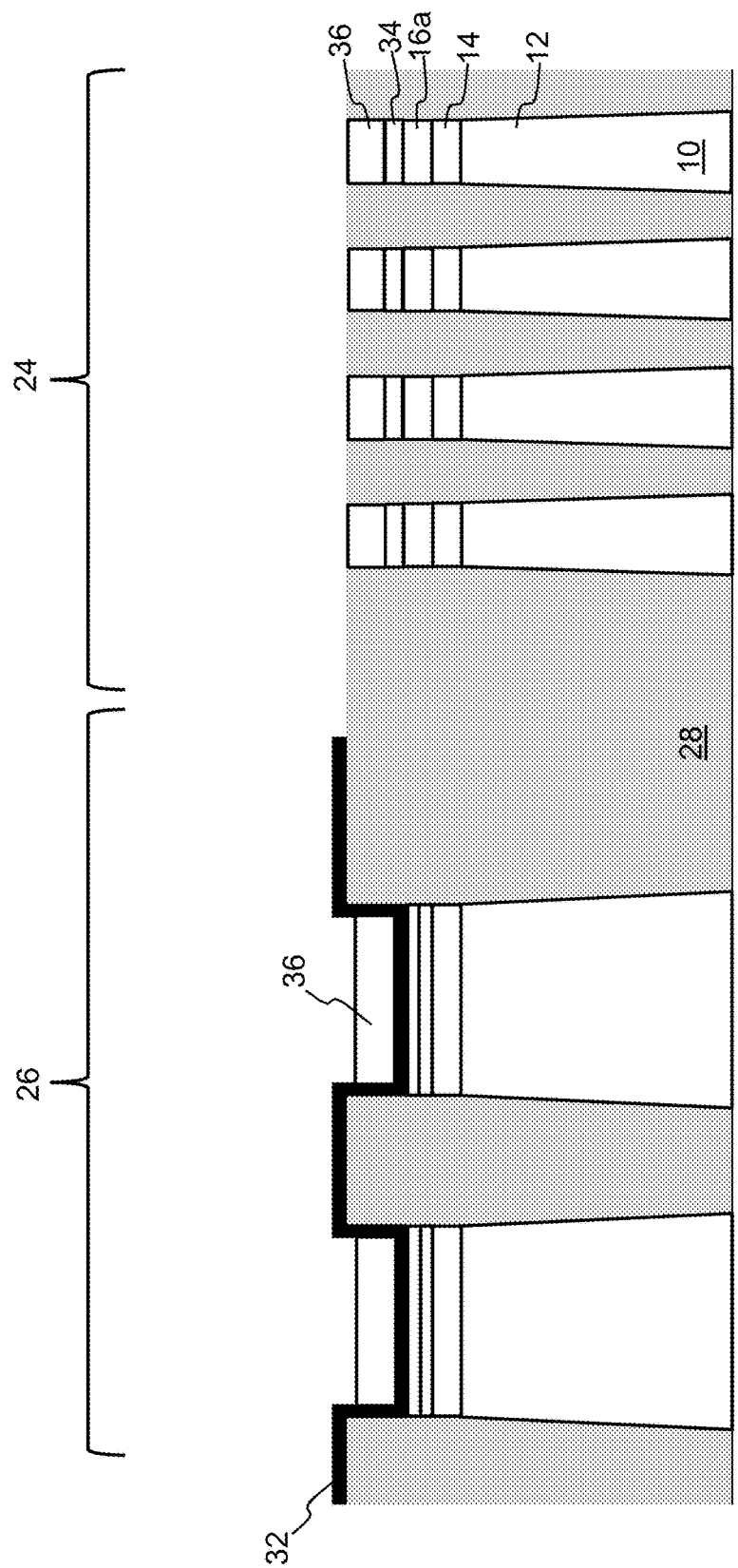

An oxide formation step (e.g. oxidation) is then used to form an oxide layer (FG Ox) 34 on the thickened silicon layer 16a in the memory area 24 (which is the oxide on which the memory cell floating gates will be formed). Polysilicon is formed over the structure, followed by a poly etching (e.g. CMP), leaving a poly layer 36 in the second trenches (between STI oxide stacks 28) in both the logic area 26 and the memory area 24. A photolithography masking step is used to cover the memory area 24 only, so that a poly etch can be performed to reduce the height of the poly layer 36 in the logic area 26, and so that thicknesses of the poly layer 36 in the memory area 24 and the logic area 36 are approximately equal, as shown in FIG. 8 (after photoresist removal). This allows for subsequent poly etching in both the memory area and the logic area to be done at the same time. This step could be skipped if the poly layer thicknesses are already about the same after poly etching (e.g., CMP).

Figure 9:
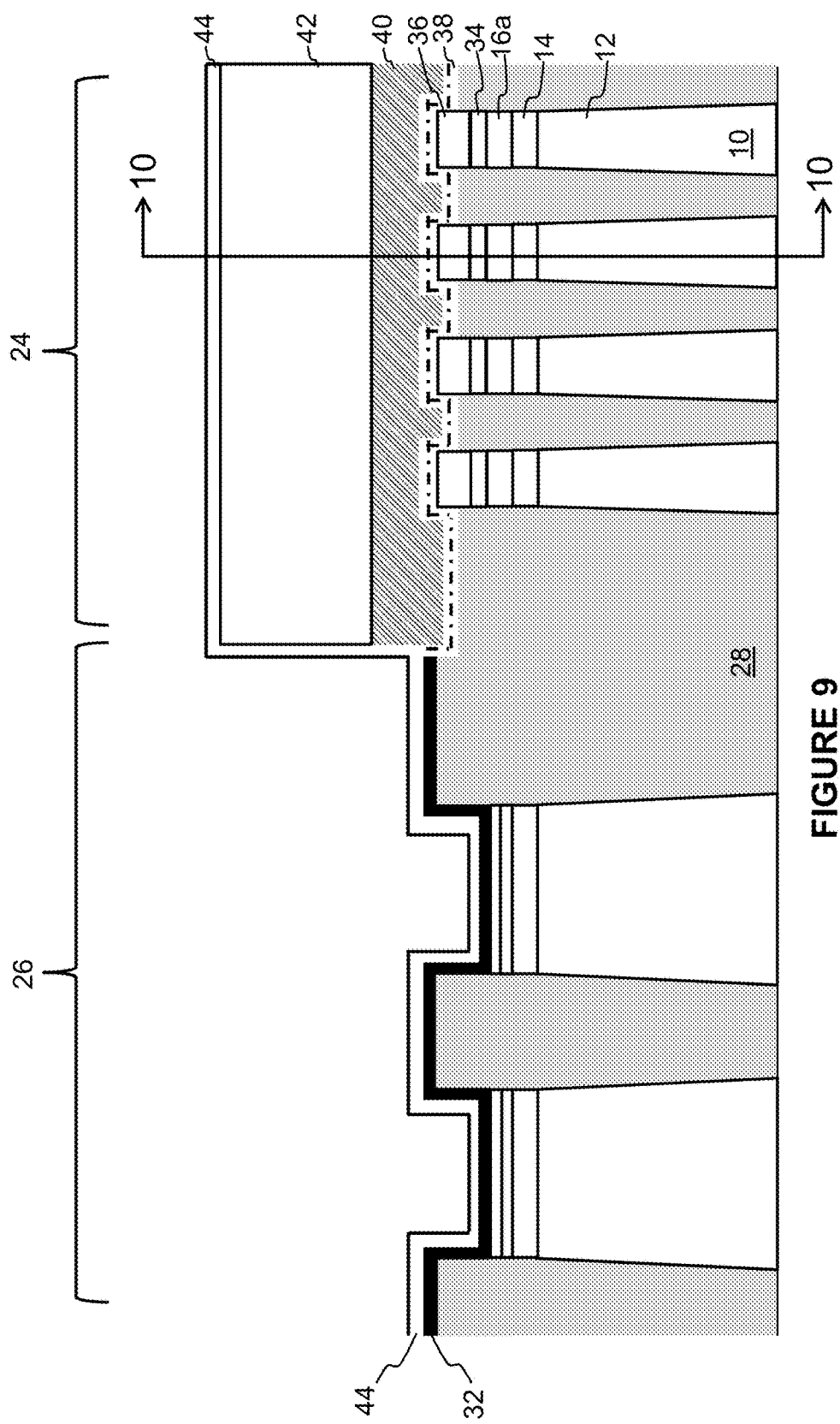
Figure 10:
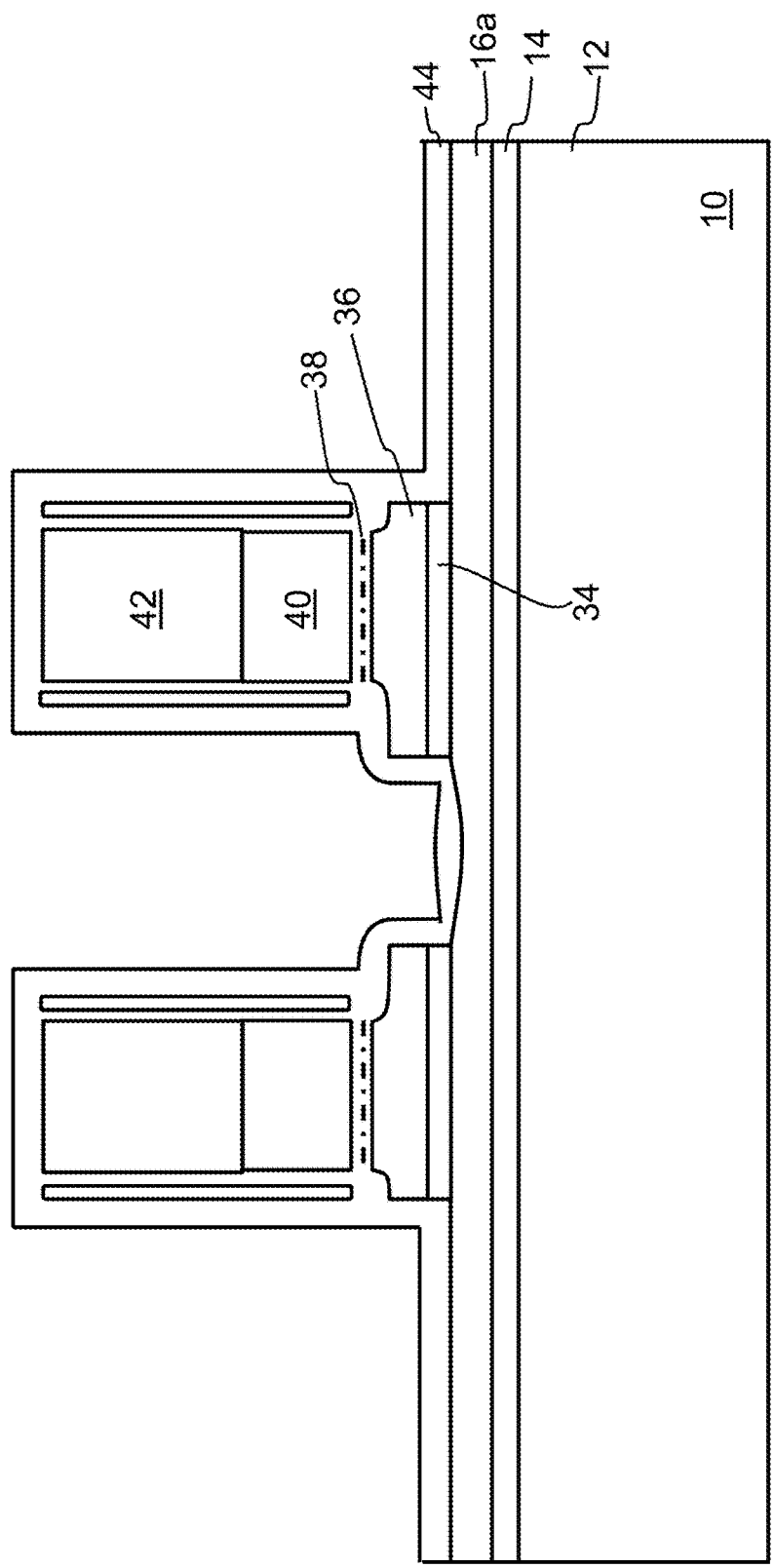
FIGS. 10, 12, 14 and 16 are side cross sectional views, orthogonal to those of FIGS. 9, 11, 13, and 15 respectively, of the memory area illustrating the next processing steps performed to manufacture the embedded memory device of the present invention.

A series of processing steps are next performed to complete the memory cell formation in the memory area 24, which are well known in the art. Specifically, the polysilicon 36 in the memory area 24 forms the memory cell floating gates. An optional oxide etch can be used to lower the tops of STI oxide 28 in the memory area 24. Memory stack structures are formed starting with forming a composite insulating layer (e.g. oxide/nitride/oxide—ONO) 38 over the polysilicon 36 and STI oxide 28. A conductive control gate CG 40 (e.g. polysilicon) is formed on the composite insulating layer 38 in the memory area 24 and over the FG poly 36, and a hard mask material 42 (CG Hard Mask, such as nitride or a composite layer of nitride, oxide and nitride) is formed over the control gate 40. The CG hard mask 42, control gate poly 40, ONO insulation 38 and FG poly 36 are removed from the logic area 26 during the memory cell stack etching. A tunnel oxide layer 44 is then formed in both the memory area 24 and the logic area 26 (by CVD deposition). FIGS. 9 and 10 show the resulting structure (FIG. 10 is a view orthogonal to that of FIG. 9 showing memory cells being formed in the memory area 24).

Figure 11:
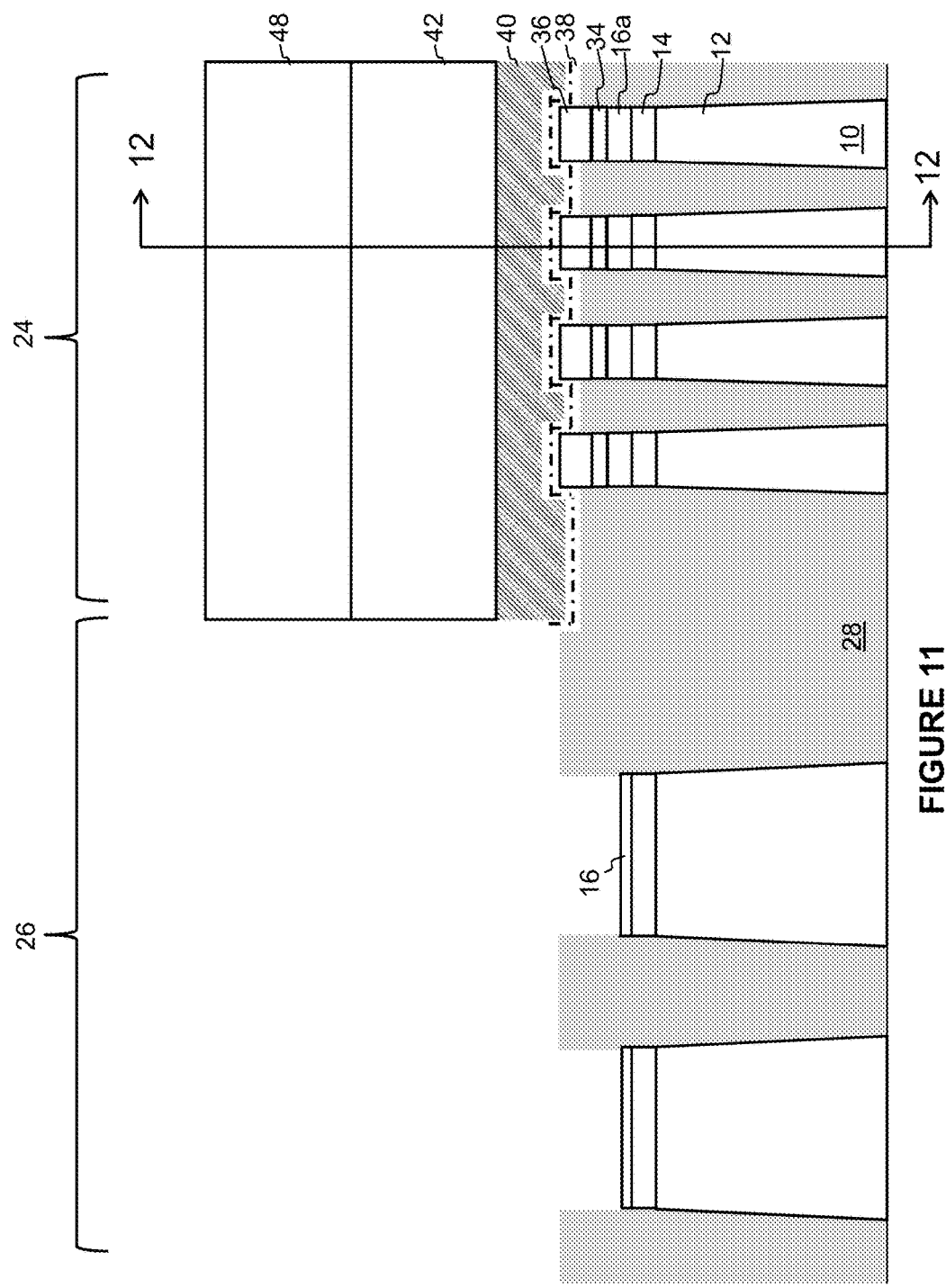
Figure 12:
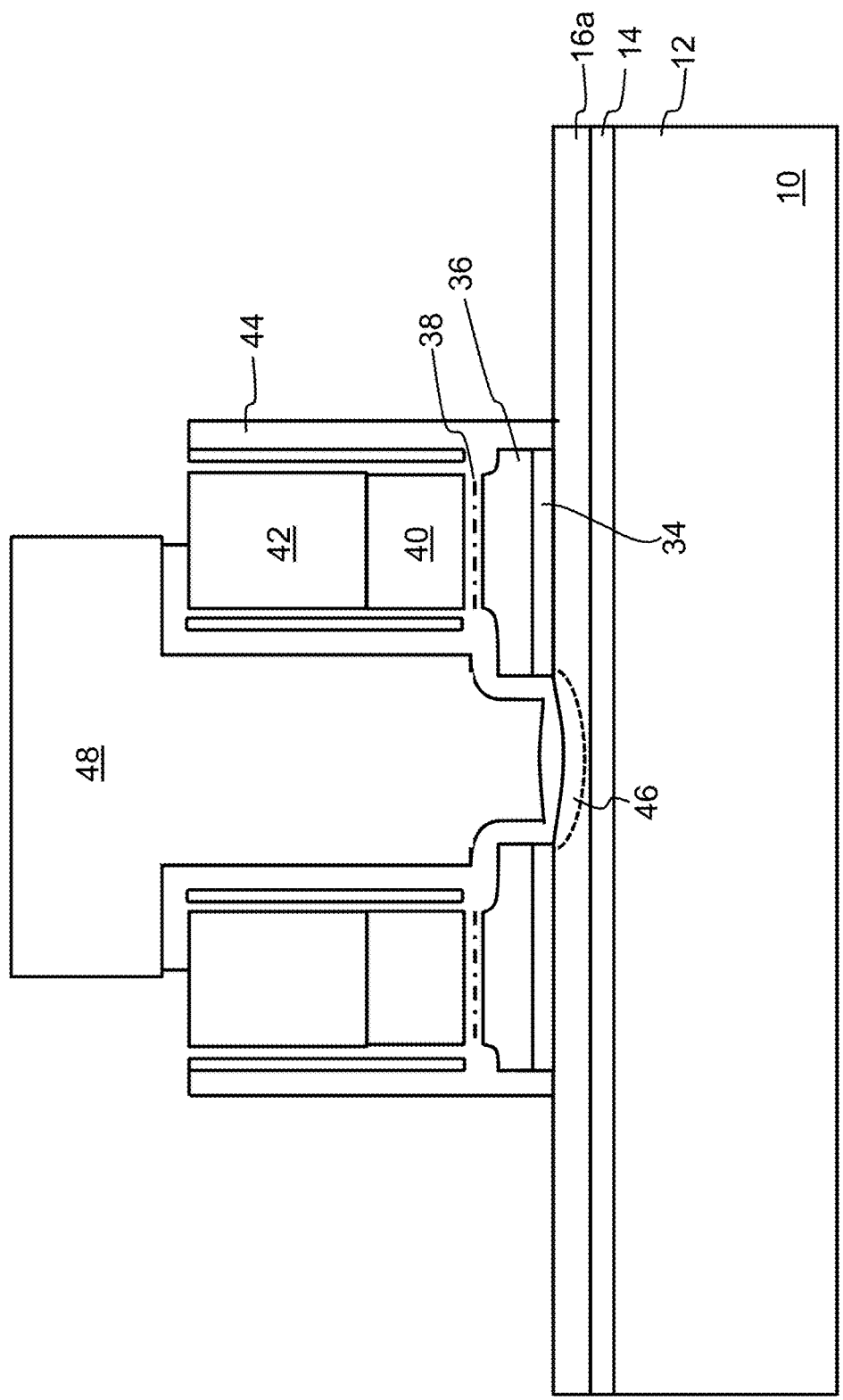

A source junction SL 46 is formed (e.g. implanted) in the thickness enhanced silicon layer 16a of the memory area 24 between adjacent floating gates (FG Poly) 36 (e.g. using patterned photo resist to prevent implantation in other exposed areas of the substrate 10). Photo resist 48 is then formed partially covering pairs of memory cells (by photolithographic exposure and selective removal of the photo resist). Oxide and nitride etches are then performed to remove portions of oxide layers 18 and 44 and nitride layer 32 not protected by photo resist, exposing the thin silicon layer 16 of the logic area 26 of the SOI substrate 10. Spacers of oxide layer 44 remain along the sidewalls of floating gate 36, control gate 40 and hard mask 42. FIGS. 11 and 12 show the resulting structures.

Figure 13:
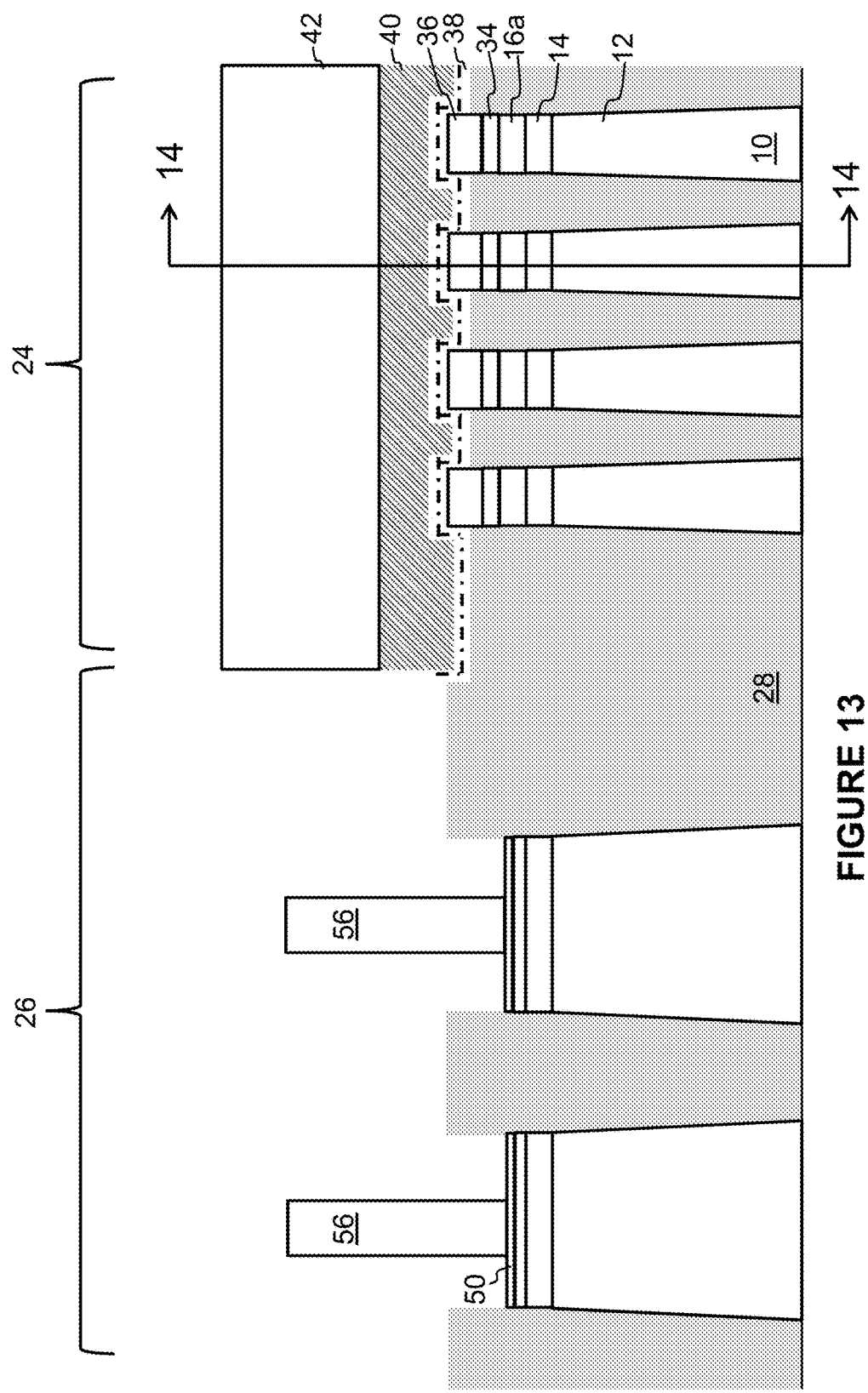
Figure 14:
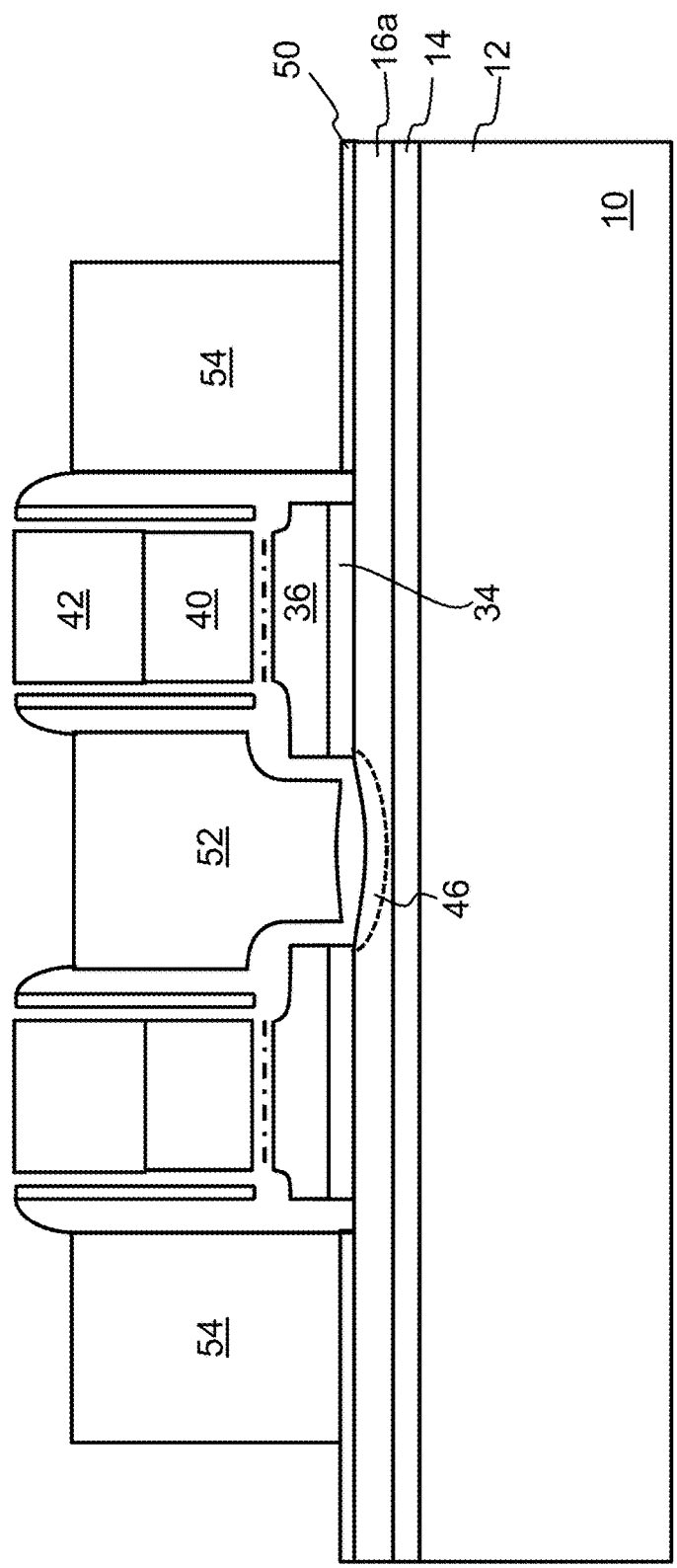

After removal of photo resist 48, an insulation layer 50 (e.g. oxide) is then formed on the exposed silicon 16 in logic area 26 and the exposed silicon 16a in the memory area 24, by for example thermal oxidation. A layer of polysilicon is then deposited and etched back to form erase gates EG 52 over source regions 46, word line (select) gates 54 on the other sides of floating gates 36 in the memory area 24, and logic gates 56 in the logic area 26 (using photolithography patterning and etch processes). Preferably, these poly gates are formed as follows. First, a layer of polysilicon is deposited over the structure. A protective insulator such as oxide is deposited on the polysilicon. The protective oxide is removed in the memory area 24 but not in the logic area 26 using photolithographic and oxide etch processes. Dummy polysilicon is then deposited over the structure. Poly CMP and etch back processes are used to form the gate poly 52/54 in the memory area 24. The protective oxide in the logic area 26 prevents the poly etch and etch back processes from affecting the polysilicon in the logic region 26 (once the dummy polysilicon is removed). Then, photolithographic and etch processes are used to pattern the polysilicon in the logic area 26 to form the logic gates 56, and to complete forming the WL gates 54 in the memory area 24. The resulting structure is shown in FIGS. 13 and 14.

Figure 15:
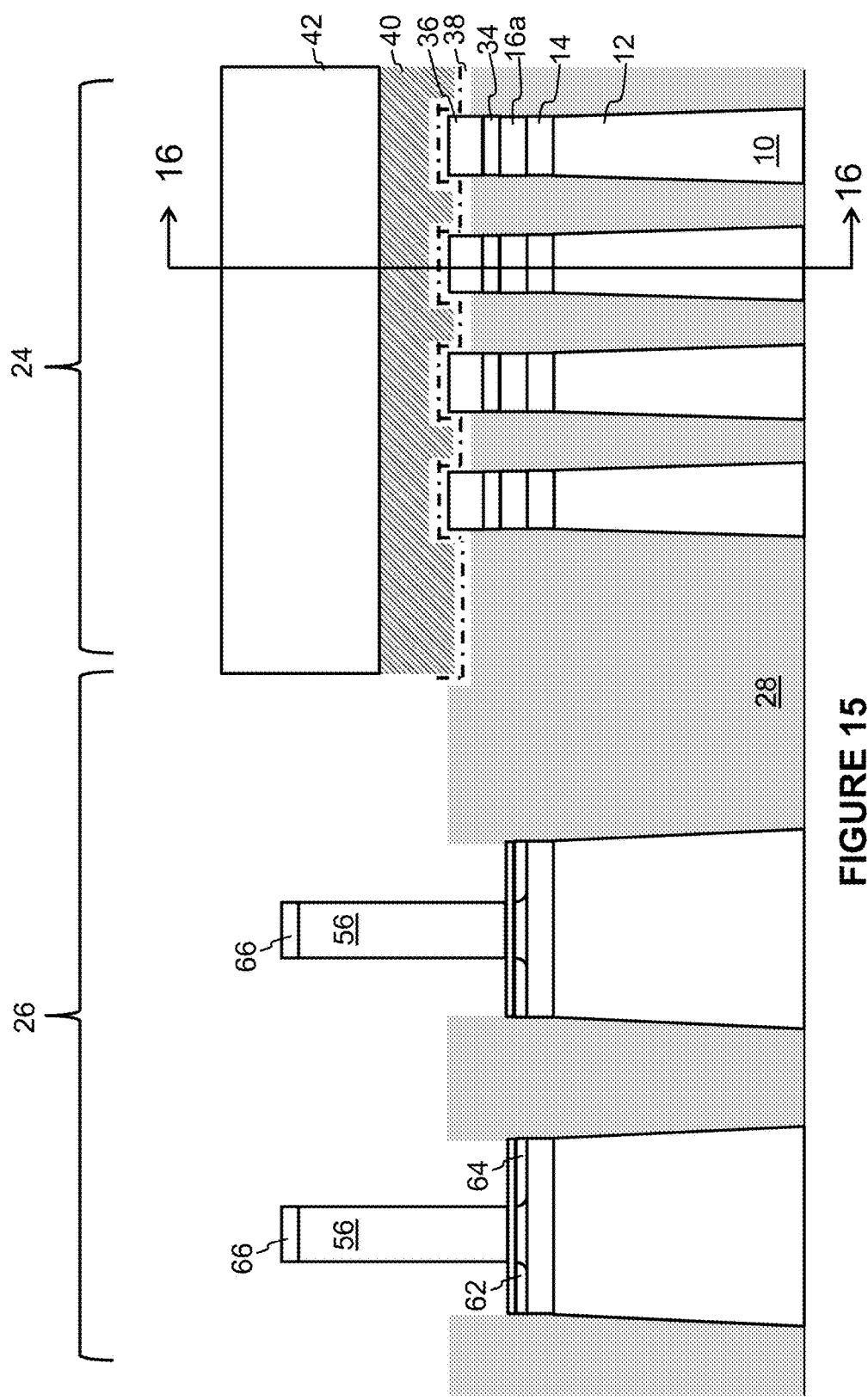
Figure 16:
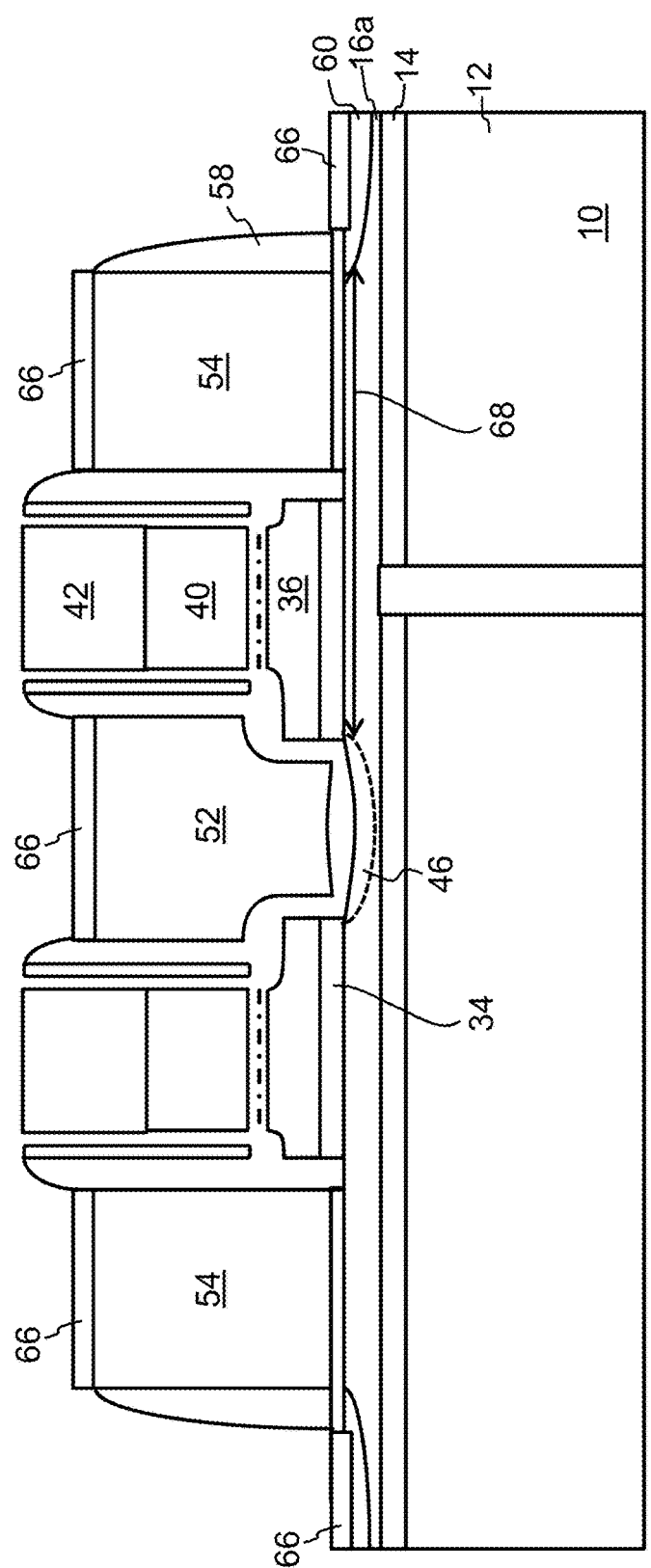

An LLD implant into the substrate 10 is next performed, which is followed by the formation of LDD spacers 58 (e.g. oxide) along the WL gates 54 in the memory area 24. An N+ implantation is then performed to complete the formation of the drain diffusion regions 60 in substrate adjacent the WL gates 54 in the memory area 24, and source and drain diffusion regions 62/64 in the thin silicon layer 16 to complete the logic devices in the logic area 26. The exposed poly and silicon portions of the structure can be exposed to a metallization process to form a layer of silicide 66 for enhanced conductivity. The final structures are shown in FIGS. 15 and 16.

In the memory area 24, the source and drain regions 46/60 define a channel region 68 there between, with the floating gate 36 disposed over and controlling a first portion of the channel region 68 and the select gate 54 disposed over and controlling a second portion of the channel region 68. The formation of these memory cells is known in the art (see U.S. Pat. Nos. 6,747,310, 7,868,375 and 7,927,994 incorporated herein by reference above) and not further described herein. The memory cells each have a floating gate 36, control gate 40, source region 46, select gate 54, erase gate 52, and drain region 60. In the logic area, each logic device includes a conductive gate 56, source region 62 and drain region 64.

The above described manufacturing process forms memory cells and logic devices on the same SOI substrate, where the layer of silicon on the embedded insulator layer of the SOI substrate is enlarged in thickness relative to the silicon layer in the logic area. This configuration allows the source and drain regions of the memory cells to extend deeper into the silicon than the source and drain regions in the logic area, to sustain a higher breakdown voltage compared to that for the logic N+ junction. The process also allows for the same polysilicon deposition process to form the erase and select gates in the memory area and the logic gates in the logic area. The raised silicon allows for the formation of a floating gate oxide by using thermal oxidation, CVD, or combination of both because the thermal oxidation will oxidize the silicon and make it thinner. The SL junction will be deeper than logic N+ junction due to thicker silicon and higher HVII implant energy.

It is to be understood that the present invention is not limited to the embodiment(s) described above and illustrated herein. For example, references to the present invention herein are not intended to limit the scope of any claim or claim term, but instead merely make reference to one or more features that may eventually be covered by one or more claims. Materials, processes and numerical examples described above are exemplary only, and should not be deemed to limit the claims. Further, not all method steps need be performed in the exact order illustrated, but rather in any order that allows the proper formation of the memory cell area and the logic area of the present invention. The memory cells can include additional or fewer gates than described above and illustrated in the figures. For example, the memory cells can exclude the control gate and/or the erase gate. Lastly, single layers of material could be formed as multiple layers of such or similar materials, and vice versa.

It should be noted that, as used herein, the terms "over" and "on" both inclusively include "directly on" (no intermediate materials, elements or space disposed therebetween) and "indirectly on" (intermediate materials, elements or space disposed therebetween). Likewise, the term "adjacent" includes "directly adjacent" (no intermediate materials, elements or space disposed therebetween) and "indirectly adjacent" (intermediate materials, elements or space disposed there between). For example, forming an element "over a substrate" can include forming the element directly on the substrate with no intermediate materials/elements therebetween, as well as forming the element indirectly on the substrate with one or more intermediate materials/elements therebetween.

What is claimed is:

1. A method of forming a semiconductor device, comprising:
   providing a substrate that includes silicon, a first insulation layer directly over the silicon, and a silicon layer directly over the first insulation layer;
   epitaxially growing silicon on the silicon layer in a first area of the substrate and not in a second area of the substrate such that the silicon layer is thicker in the first area of the substrate relative to the second area of the substrate;
   forming memory cells in the first area of the substrate, wherein the forming of each of the memory cells includes:
      forming spaced apart first source and first drain regions in the silicon layer in the first area of the substrate, defining a channel region there between,
      forming a floating gate over and insulated from a first portion of the channel region, and
      forming a select gate over and insulated from a second portion of the channel region;
   forming logic devices in the second area of the substrate, wherein the forming of each of the logic devices includes:
      forming spaced apart second source and second drain regions the silicon layer in the second area of the substrate, and
      forming a conductive gate over and insulated from a portion of the silicon layer between the second source and second drain regions.

2. The method of claim 1, wherein the first source and first drain regions extend deeper into the silicon layer than do the second source and second drain regions.

3. The method of claim 1, wherein the first source and first drain regions each have a breakdown voltage that is greater than that of each of the second source and second drain regions.

4. The method of claim 1, wherein the forming of each of the memory cells further comprises:
   forming a control gate over and insulated from the floating gate; and
   forming an erase gate over and insulated from the first source region.

5. The method of claim 4, wherein the forming of the conductive gates, the select gates and the erase gates further comprises:
   forming a polysilicon layer that extends along the first and second areas of the substrate; and
   selectively removing portions of the polysilicon layer such that remaining portions of the polysilicon layer in the first area of the substrate constitute the select gates and the erase gates and remaining portions of the polysilicon layer in the second area of the substrate constitute the conductive gates.

6. The method of claim 1, wherein the epitaxially growing further comprises:
   forming a second insulation layer over the silicon layer in the first and second areas of the substrate;
   removing the second insulation layer from the first area of the substrate while maintaining the second insulation layer in the second area of the substrate;

performing an epitaxial growth process that grows the silicon on the silicon layer in the first area of the substrate and not on the silicon layer in the second area of the substrate; and removing the second insulation layer from the second area of the substrate.

7. The method of claim 1, wherein the epitaxially growing further comprises:

forming a second insulation layer directly on the silicon layer in the first and second areas of the substrate;

forming a third insulation layer directly on the second insulation layer in the first and second areas of the substrate;

forming trenches each extending through the third insulation layer, the second insulation layer, the silicon layer, the first insulation, and into the silicon, in the first and second areas of the substrate;

at least partially filling the trenches with an insulation material;

removing the third insulation layer from the first and second areas of the substrate;

forming a fourth insulation layer over the second insulation layer in the first and second areas of the substrate;

removing the fourth insulation layer from the first area of the substrate while maintaining the fourth insulation layer in the second area of the substrate;

removing the second insulation layer from the first area of the substrate;

performing an epitaxial growth process that grows the silicon on the silicon layer in the first area of the substrate and not on the silicon layer in the second area of the substrate; and removing the fourth insulation layer from the second area of the substrate.

8. The method of claim 7, wherein the forming trenches further comprises:

performing an isotropic etch to widen the trenches at the third insulation layer and not at the second insulation layer.

\* \* \* \* \*

UNITED STATES PATENT AND TRADEMARK OFFICE
CERTIFICATE OF CORRECTION

PATENT NO. : 9,634,020 B1
APPLICATION NO. : 15/225425
DATED : April 25, 2017
INVENTOR(S) : Chien Sheng Su, Mandana Tadayoni and Nhan Do Page 1 of 1

It is certified that error appears in the above-identified patent and that said Letters Patent is hereby corrected as shown below:

In the Claims

Column 6
Line 31, the phrase "regions the silicon" should read -- regions in the silicon --.

Signed and Sealed this
Twentieth Day of June, 2017

Joseph Matal
*Performing the Functions and Duties of the*
*Under Secretary of Commerce for Intellectual Property and*
*Director of the United States Patent and Trademark Office*